(12) United States Patent
Wei et al.

(10) Patent No.: US 7,759,680 B2
(45) Date of Patent: Jul. 20, 2010

(54) THIN-FILM TRANSISTOR AND DIODE ARRAY FOR AN IMAGER PANEL OR THE LIKE

(75) Inventors: Ching-Yeu Wei, Niskayuna, NY (US); Douglas Albagli, Clifton Park, NY (US); William Hennessy, Schenectady, NY (US)

(73) Assignee: General Electric Company, Niskayuna, NY (US)

( * ) Notice: Subject to any disclaimer, the term of this patent is extended or adjusted under 35 U.S.C. 154(b) by 737 days.

(21) Appl. No.: 11/291,602

(22) Filed: Nov. 30, 2005

(65) Prior Publication Data

US 2007/0122948 A1    May 31, 2007

(51) Int. Cl.
*H01L 31/00* (2006.01)
(52) U.S. Cl. .................. 257/59; 257/292; 257/E21.561; 257/E29.287; 438/151
(58) Field of Classification Search .................. 257/288, 257/577, 57–61, 290, 291–294, E21.561, 257/E29.587; 438/151–166
See application file for complete search history.

(56) References Cited

U.S. PATENT DOCUMENTS

2003/0173669 A1*   9/2003   Shau .......................... 257/758

* cited by examiner

*Primary Examiner*—Richard A. Booth
(74) *Attorney, Agent, or Firm*—Scott J. Asmus

(57) ABSTRACT

Briefly, in accordance with one or more embodiments, a detector panel of an imaging system may be produced from a photodiode array integrated with a thin-film transistor array. The thin film transistor array may have one or more vias formed for increasing the adhesion of the photodiode array to the thin-film transistor array. The vias may comprise sidewalls having stepped structures. The thin-film transistor array may comprise a first metallization layer and a second metallization layer. A third metallization layer may be added to the thin film transistor array wherein diodes of the photodiode array may contact the third metallization layer. Diodes of the photodiode array may contact the first metallization layer and/or the second metallization layer via the third metallization layer without directly contacting the first metallization layer or the second metallization layer.

15 Claims, 8 Drawing Sheets

FIG. 7
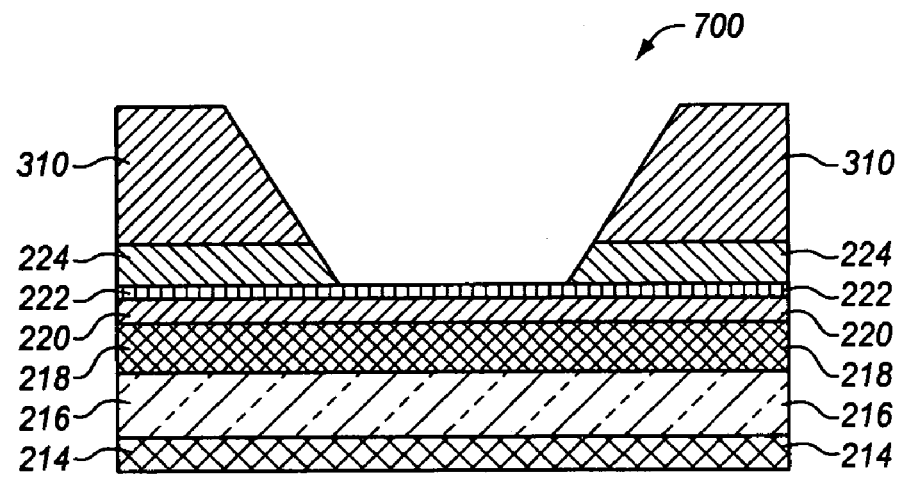
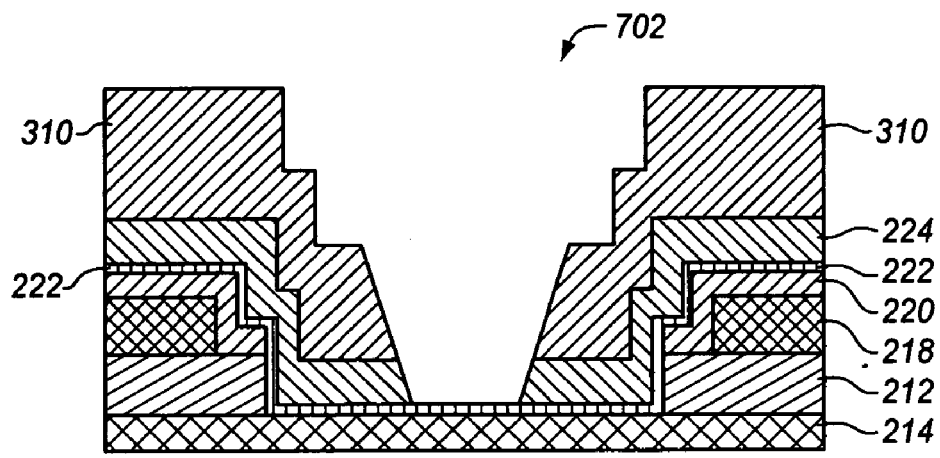
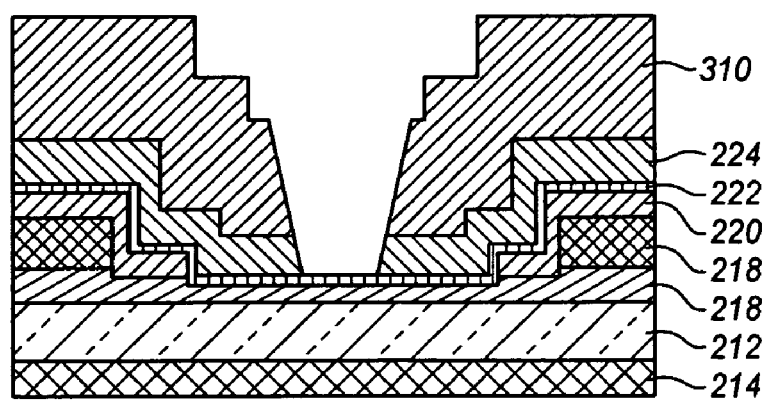

THIN-FILM TRANSISTOR AND DIODE ARRAY FOR AN IMAGER PANEL OR THE LIKE

BACKGROUND

Photosensitive elements for converting incident radiant energy into an electrical signal are commonly used in imaging applications, for example, x-ray imagers and/or facsimile machine type devices. Hydrogenated amorphous silicon (a-Si) and alloys of a-Si are commonly used in the fabrication of photosensitive elements due to the photoelectric characteristics of a-Si and/or the relative ease of fabrication. In particular, photosensitive elements, such as photodiodes, can be formed in conjunction with associated control or switching elements, such as thin film transistors (TFTs), in relatively large area arrays, for example to form a detector panel for an x-ray imaging system or the like.

Photodiodes typically may include an island or body of photosensitive material, such as a-Si, disposed between two electrodes electrically coupled to opposite surfaces of the photodiode body. Such photodiodes typically comprise p-type material, intrinsic type material, and n-type material, referred to as PIN diodes or the like. As incident radiation is absorbed in the a-Si, holes and electrons may be produced and move toward the upper or lower surface of the photodiode dependent on the electric filed established by the electrodes. The amount of charge collected at the electrodes is a function of the energy flux of the incident light. Periodic measuring of charge collected on a photodiode, and resetting the diode to a known charge condition, may be utilized to process electrical signals generated by the photodiode in response to incident radiation, for example photons emitted from an x-ray source that impinge upon the detector panel in an x-ray imaging system.

It may be the case that a TFT array for an imaging system may be produced in a different process, at a different time, and/or at a different location, for example at a different manufacturing facility, than the process by which the diode array is produced and integrated with the TFT array to produce an operational detector panel for an x-ray imaging system of the like. Such a TFT array may be manufactured using the same and/or similar process as a TFT array for displays. However such a fabrication process, when a photodiode array is integrated with the TFT array, may result in issues deleterious to the mechanical reliability and/or integrity of the detector panel. Such issues may include, for example, that the diode film may not adhere robustly to the TFT array, that the hydrofluoric (HF) wet etchant utilized to etch off oxide and nitride to form a via structure to make contact to the source-drain (S/D) metal of the TFT may attack the S/D metal, which may be referred to as the second metal layer, or M2 metal, and/or potential long term reliability for the diode to M2 metal contacts because such M2 metal of the TFT array may include and/or otherwise comprise an aluminum alloy, typically Mo/Al/Mo and/or Mo/Al(Nd)/Mo. In general, standard processes for producing a TFT array may not be completely compatible with processes for producing a photodiode array to be integrated with the TFT array to form a detector panel for an imaging system or the like.

DESCRIPTION OF THE DRAWING FIGURES

Claimed subject matter is particularly pointed out and distinctly claimed in the concluding portion of the specification. However, both as to organization and/or method of operation, together with objects, features, and/or advantages thereof, may best be understood by reference to the following detailed description when read with the accompanying drawings in which:

FIG. 7 is a diagram of a cross-sectional view of diode via designs in accordance with one or more embodiments.

Figure 1:
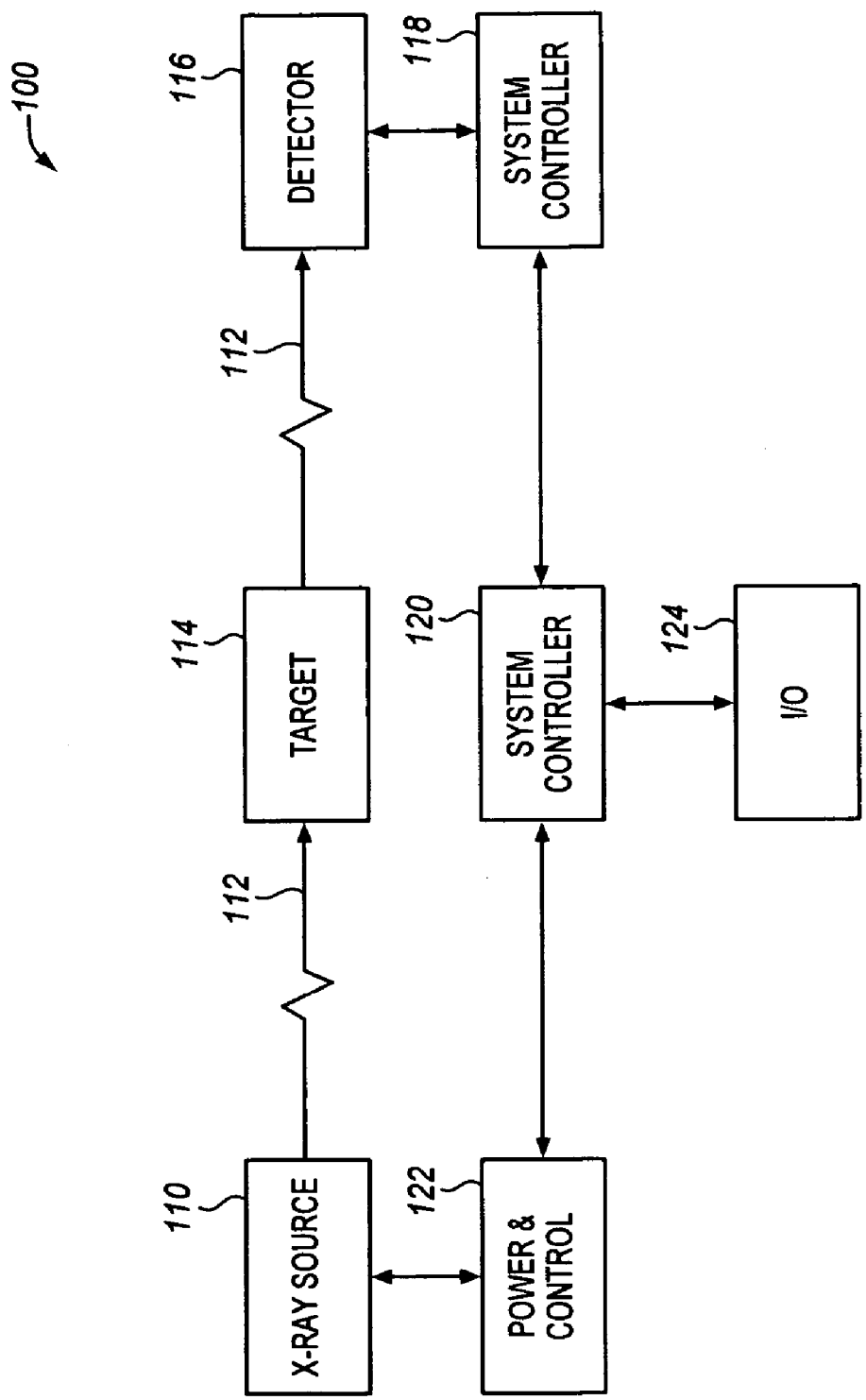
FIG. 1 is a block diagram of an imaging system in accordance with one or more embodiments.

It will be appreciated that for simplicity and/or clarity of illustration, elements illustrated in the figures have not necessarily been drawn to scale. For example, the dimensions of some of the elements may be exaggerated relative to other elements for clarity. Further, if considered appropriate, reference numerals have been repeated among the figures to indicate corresponding or analogous elements.

DETAILED DESCRIPTION

In the following detailed description, numerous specific details are set forth to provide a thorough understanding of claimed subject matter. However, it will be understood by those skilled in the art that claimed subject matter may be practiced without these specific details. In other instances, well-known methods, procedures, components and/or circuits have not been described in detail.

In the following description and/or claims, the terms coupled and/or connected, along with their derivatives, may be used. In particular embodiments, connected may be used to indicate that two or more elements are in direct physical and/or electrical contact with each other. Coupled may mean that two or more elements are in direct physical and/or electrical contact. However, coupled may also mean that two or more elements may not be in direct contact with each other, but yet may still cooperate and/or interact with each other. Furthermore, the term "and/or" may mean "and", it may mean "or", it may mean "exclusive-or", it may mean "one", it may mean "some, but not all", it may mean "neither", and/or it may mean "both", although the scope of claimed subject matter is not limited in this respect.

Referring now to FIG. 1, a block diagram of an imaging system in accordance with one or more embodiments will be discussed. As shown in FIG. 1, imaging system 100 may include x-ray source 110 that is capable of generating and emitting photons 112 suitable for producing an image. In one or more alternative embodiments, x-ray source may be any type of source capable of emitting particles or waves suitable for producing an image, and the scope of the claimed subject matter is not limited in this respect. Photons 112 may impinge upon target 114, which may be, for example an animal and/or human target where imaging system 100 is utilized in medical applications. Alternatively, target 114 may be any suitable target where an image of target 114 may be desirable, for example in inspection of manufactured parts, although the scope of the claimed subject matter is not limited in this respect. At least a portion of photons 112 may pass through target 112 at varying flux levels corresponding at least in part to a density of portions of target 114 where such photons 112 passing through target 114 may be detected by detector 116. Based at least in part on the varying flux levels of photons 112 detected by detector 116, detector 116 may provide an output signal to acquisition circuit 118 that is capable of generating an image, and/or data representative of an image, of target 114 from the output signal.

In general, detector panel 116 may include contact pads to which electrical contact can be made to external circuitry. Contact fingers connect the contact pads to the edge of the active TFT array area where they may electrically connect to scan and/or data lines, and/or to the common electrode or electrodes of the TFT array. A detector panel of an x-ray imaging system or the like may be formed on a substantially flat substrate, typical but not necessarily glass. The imager may comprise an array of pixels with photosensitive elements, such as photodiodes, that may have associated switching elements, for example thin film transistors (TFTs). In operation, the voltage on the scan lines, and hence that of the gates of TFTs of the pixels associated with the scan lines, may be switched on in a predetermined sequence allowing charge on photodiode of a scanned line to be read out via the data address lines. The scan and data address lines typically may be disposed in a perpendicular arrangement. Address lines comprise a region in the array, and the region or regions outside the array comprise the contact finger or fingers and guard pad and guard ring which may be electrically insulated from the contact pad. Electrical contact to the guard ring may be made via separate contact pads that may not electrically connect to the array. The guard ring is typically maintained at ground potential during operation. The guard ring may be utilized, for example, to protect the array from electrostatic discharge during formation of detector panel 116, and/or during connection of detector panel to external circuitry.

The contact pad may be defined by an area of conducting material disposed on a surface of the substrate on a pad surface. The contact pad region, may include the surface contact region and/or any additional regions with structures that electrically connect the surface pad to the main body of the contact finger. Usually the contact pad is at the end of the contact finger, and the guard ring may be disposed outside the contact pad. In one or more embodiments of detector panel 116, address lines may have two or more contact fingers and contact pads, for example at opposite ends of the array, although the scope of the claimed subject matter is not limited in this respect.

System controller 120 may receive the image generated by acquisition circuit 118 and may perform various control and processing functions for imaging system 100. For example, system controller 120 may couple with power and control unit 122 to control the operation of x-ray source 110. Likewise, system controller 120 may control the operation of acquisition circuit 118 and/or detector 116, and may be further coupled to an input/output (I/O) system 124. I/O system 124 may include one or more controls for allowing an operator to operate imaging system 100, and/or may couple to one or more devices for displaying and/or storing images of target 114 captured by detector 116. For example, I/O system 124 may couple to a liquid-crystal display (not shown) or the like for displaying images captured by detector 116. Furthermore, I/O system 124 may couple to a hard disk drive or other types of storage media for storing images captured by detector 116. In one or more embodiments, I/O system 124 may couple to a network adaptor, modem, and/or router (not shown), for example to send images captured by detector to other devices and/or nodes on a network. Furthermore, such a network adaptor, modem, and/or router may allow a remoter operate to download and/or view images capture by detector 116, for example as captured and stored as data files, and/or to receive and/or view such images in real-time or in near real-time, and/or to otherwise control the operation of imaging system 100 from a remote location for example from a machine coupled to imaging system 100 via the Internet. However, these are merely examples of embodiments for control of and/or communication with imaging system 100, and the scope of the claimed subject matter is not limited in these respects.

In one or more embodiments, system controller 120 may include at least one or more processors for executing control functions of imaging system 100, for controlling the image capturing process of imaging system 100, and/or for electronic processing of images capture by detector 116. In one or more embodiments, system controller 120 may include one or more general purpose processors having one or more processor cores, and in one or more embodiments system controller 120 may include one or more special purpose processors such as a digital signal processor, for example to perform image processing on images captured by detector 116. In one or more embodiments, system controller 120 may comprise a general purpose computer platform, workstation, and/or server, and in one or more alternative embodiments, system controller 120 may comprise a special purpose platform designed for imaging tasks. However, these are merely example embodiments of system controller 120, and the scope of the claimed subject matter is not limited in these respects.

In one or more embodiments, detector 116 may comprise an array of a-Si PIN photodiodes coupling to, for example a layer of x-ray scintillator such as cesium iodide (CsI), cesium bromide (CsBr), or the like, capable of converting x-ray photons 112 emitted from x-ray source 110 to visible photons which are then detected by the photodiodes. Such an a-Si photodiode/CsI detector may be referred to as an indirect conversion detector in which the CsI layer may function as the x-ray scintillator to convert x-ray photons to visible photons, and the photodiode may function to detect and to convert the visible photons to an electrical signal representative of an image of target 114. The photodiode/x-ray scintillator detectors in such an array may include corresponding array of transistors, for example thin film transistors (TFTs) and other circuits for controlling the array of photodiode/x-ray scintillator detectors, and for reading signals from the diode detectors based at least in part on the flux and/or intensity of photons 112 impinging on the diode detectors. In one or more embodiments, detector 116 may comprise an array of pixels comprising one or more subpixels that may be served by individual charge integrating amplifiers, shapers, discriminators and/or counting circuits, although the scope of the claimed subject matter is not limited in this respect.

In one or more embodiments, detector 116 may be a semiconductor x-ray scintillator based detector 116, for example a layer of semiconductor x-ray scintillator detectors such as lead oxide (PbO), amorphous selenium (Se), and so on, capable of detecting x-ray photons 112 directly emitted from x-ray source 110. Such a semiconductor x-ray scintillator based detector may be referred to as a direct conversion detector in which the semiconductor x-ray scintillator functions as both the x-ray scintillator and the photodiode and thus is capable of directly converting photons 112 from x-ray source 110 into an electrical signal representative of an image of target 114. The semiconductor x-ray scintillator detectors in such an array may include corresponding array of transistors, for example thin film transistors (TFTs) and other circuits for controlling the array of semiconductor x-ray scintillator detectors, and for reading signals from the diode detectors based at least in part on the flux and/or intensity of photons 112 impinging on the diode detectors. In one or more embodiments, detector 116 may comprise an array of pixels comprising one or more subpixels that may be served by individual charge integrating amplifiers, shapers, discriminators and/or counting circuits, although the scope of the claimed subject mater is not limited in this respect.

Figure 2:
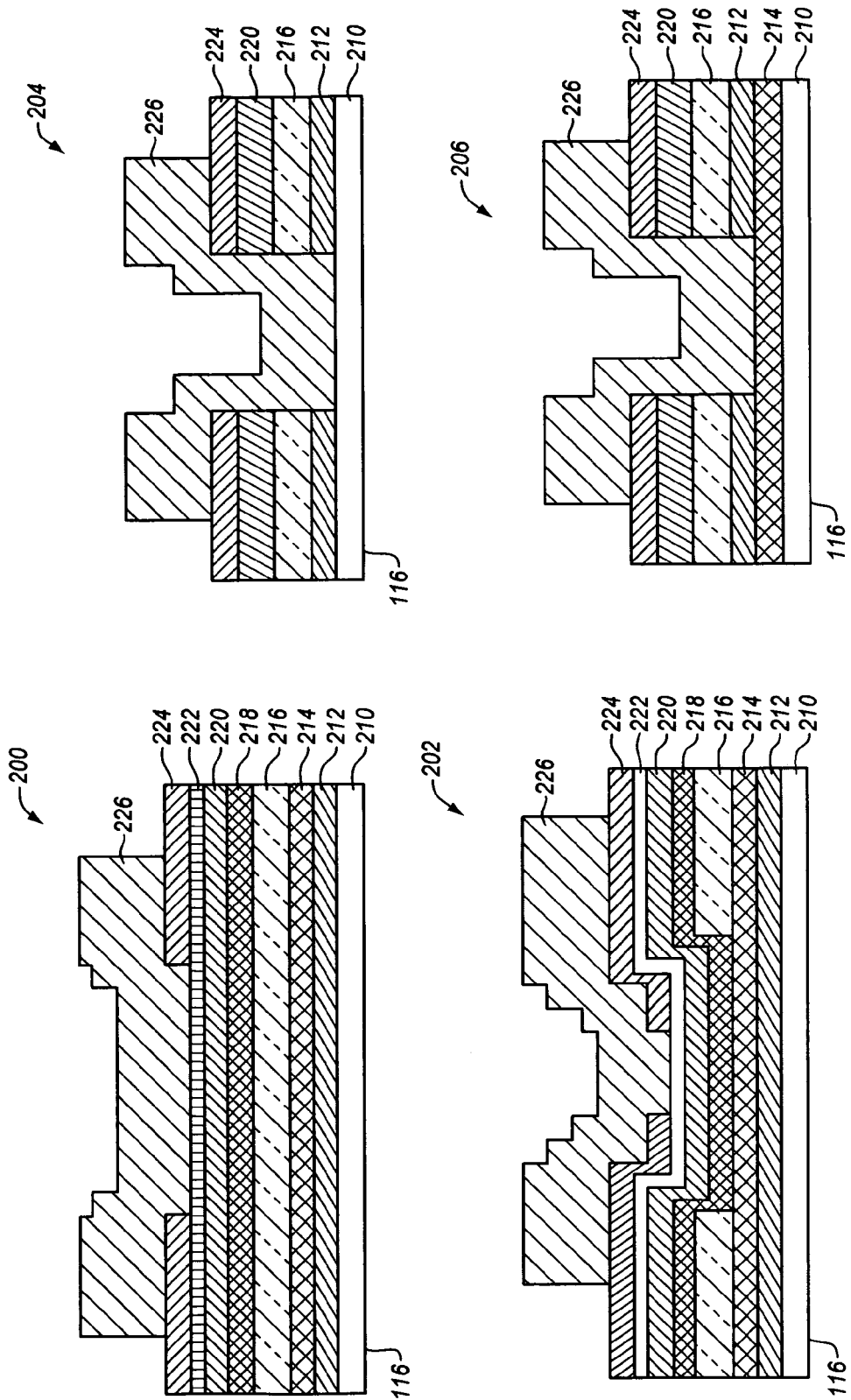
FIG. 2 is a diagram of types of via structures in a detector panel in accordance with one or more embodiments.

Referring now to FIG. 2, a diagram of types of via structures in a detector panel in accordance with one or more embodiments will be discussed. As shown FIG. 2, in one or more embodiments, four types of via structures 200, 202, 204, and/or 206 may be added to detector panel 116. Adding at least one or more of via structures 200-206 to detector panel 116 may provide an increased adhesion of photodetector diodes to detector panel 116. An amount of such increased diode adhesion may be a function of, at least in part, location and/or locations of such via structures 200-206, and/or whether there are one or more metal layers underneath a passivating nitride layer. For example, via structure 200 may be utilized at or near pixel cells, contact fingers, and/or a metal grid of detector panel 116 and may comprise one or more layers disposed on a glass substrate 210. Such contact fingers may have some or limited electrical function, but may also have some non-functional areas or region there between. One or more vias may be added on and/or near such contact fingers. A first layer 212 of silicon nitride (SiNx) may be disposed on glass substrate 210 and in one embodiment may have a thickness of approximately 2300 angstroms. A first metallization layer 214 may be disposed on layer 212 and in one embodiment may have a thickness of approximately 3500 angstroms. Gate layer 216 may be disposed on metallization layer 214, and may comprise silicon nitride and have a thickness of approximately 3500 angstroms. A second metallization layer 218 may be disposed on gate layer 216 and may have a thickness of approximately 2650 angstroms. Another layer 220 of silicon nitride may be disposed on metallization layer 218 and may comprise silicon nitride having a thickness of approximately 2500 angstroms. A third metallization layer 222 having a thickness of approximately 700 angstroms may be disposed on layer 220, and yet another layer 224 of silicon nitride may have a thick of approximately 3000 angstroms may be disposed on metallization layer 222. Diode 226 may be disposed on layer 224 and may have a thickness of approximately 16,000 angstroms in one or more embodiments, although the scope of the claimed subject matter is not limited to any particular thickness of diode 226 and/or other layers of via structures 200-206.

In one or more embodiments, adhesion of diode 226 to passivating nitride layers of the transistors of detector panel 116, such via structures 200-206 may be formed in detector panel 116, for example when manufactured. Such via structures 200-206 may be disposed, for example, at locations of detector panel 116 where there are no topographic features in the TFT array structures, and/or outside the TFT array in one or more edge clear areas. An edge clear area may be defined as essentially a dummy area having no electrical function. One or more vias, for example several thousands and/or hundreds of thousands in some embodiments, may be added to such an edge clear area. In one or more embodiments, via structures 200-206 may be disposed at locations where there is plain metal underneath the field-effect transistor (FET) passivating nitride. During one or more etching process, to prevent dilute hydrofluoric (HF) acid from attacking aluminum contained in metallization layer 218 during the diode forming processes, pure, or nearly pure, molybdenum (Mo) and/or molybdenum-tungsten (MoW) alloy in metallization layer 222 as an etch stop, and/or utilization of a dry plasma etch in lieu of, at least in part, wet etching with hydrofluoric acid in one or more embodiments. Such a metallization layer 222 comprising molybdenum may be utilized in one or more of via structures 200-206 to reduce and/or eliminate any potential long-term reliability issues of having an amorphous silicon (a-Si) diode film for diode layer 226 in contact directly with metallization layer 218 comprising aluminum or the like. In such an arrangement, the amorphous silicon of diode 226 may contact metallization layer 222 comprising molybdenum at least in part, which is disposed on silicon nitride layer 220 instead of contacting metallization layer 218 comprising aluminum and/or the like at least in part. In one or more embodiments, metallization layer 214 may be referred to as M1 metal which may be the gate metal of a TFT transistor of detector panel 116, metallization layer 218 may be referred to as M2 metal, and/or metallization layer 222 may be referred to as M3 metal, although the scope of the claimed subject matter is not limited in this respect. In one or more embodiments, metallization layer 222 may comprise a metal and/or metal alloy that is generally better for adhesion to the material from which diode 226 is fabricated, typically amorphous silicon (a-Si). Such a metal for metallization layer 222 may be a refractory metal or the like, for example molybdenum (Mo), a molybdenum alloy such as molybdenum-tungsten (MoW), and/or titanium (Ti), and/or a titanium alloy, or the like. Such a metal for metallization layer 222 may also be suitable for higher temperature processing in which diode 226 is formed. Furthermore, such a metal for metallization layer 222 may also be less chemically reactive for example with hydrofluoric acid (HF) than the metal of metallization layer 218 which may comprise aluminum for example. Such a metal may be more suitable for direct contact with diode 226 than metallization layer 218, although the scope of the claimed subject matter is not limited in this respect.

Thus, as shown in FIG. 2, via structure 200 may be formed by adding metallization layer 222 and/or silicon nitride layer 224 detector panel 116 which may otherwise contain standard TFT transistor layers for example for pixels of detector panel 116. Such an arrangement may be utilized for in pixels cells, contact fingers, and/or metal grids of detector panel 116 wherein diode 226 may contact metallization layer 222 rather than metallization layer 218. Via structure 202 may be similar to via structure 200, except metallization layer 218 may contact metallization layer 214, for example in ground-ring and/or scan repair type structures of detector panel 116. Via structure 204 may contain no metallization layers, for example in between metal grids, interconnects, and/or corner shots or the like. Via structure 206 may contain a single metallization layer 214 for example in HSD ID pads or the like. Via structures 200, 202, 204, and/or 206 are merely example arrangements of via structures that may be formed on detector panel 116, for example to increase adhesion of amorphous silicon of diode 226 to nitride passivating layers such as layer 220, and the scope of the claimed subject matter is not limited in these respects.

In one or more embodiments, via structures 200-206 may be disposed in edge clear areas outside active array areas of detector panel 116. In one embodiment, a S/D metal grid structure having a pitch of about 1000 micrometers may be sufficient. In one or more embodiments, adding an 100 to 200 micrometer array of one or more via structures grid openings may be suitable to mitigate and/or eliminate peeling of diode film from glass substrate 210 in one or more edge clear areas when the thickness of diode 226 is greater. In one or more embodiments, one or more of via structures may be added to detector panel 116 where there exists one or more metallization layers such as metallization layer 214 and/or metallization layer 218 beneath passivating nitride layers of detector panel 116, and/or to the grid structure of metallization layer 218 and/or inside each grid opening. In one or more embodiments, one or more of via structures 200-206 may be utilized to fill nearly any electrically active and/or electrically inactive areas where appropriate to mitigate and/or reduce diode film layers of diodes 226 from at least partially being separated from detector panel 116, whether temporarily and/or permanently, although the scope of the claimed subject matter is not limited in this respect.

Figure 3:
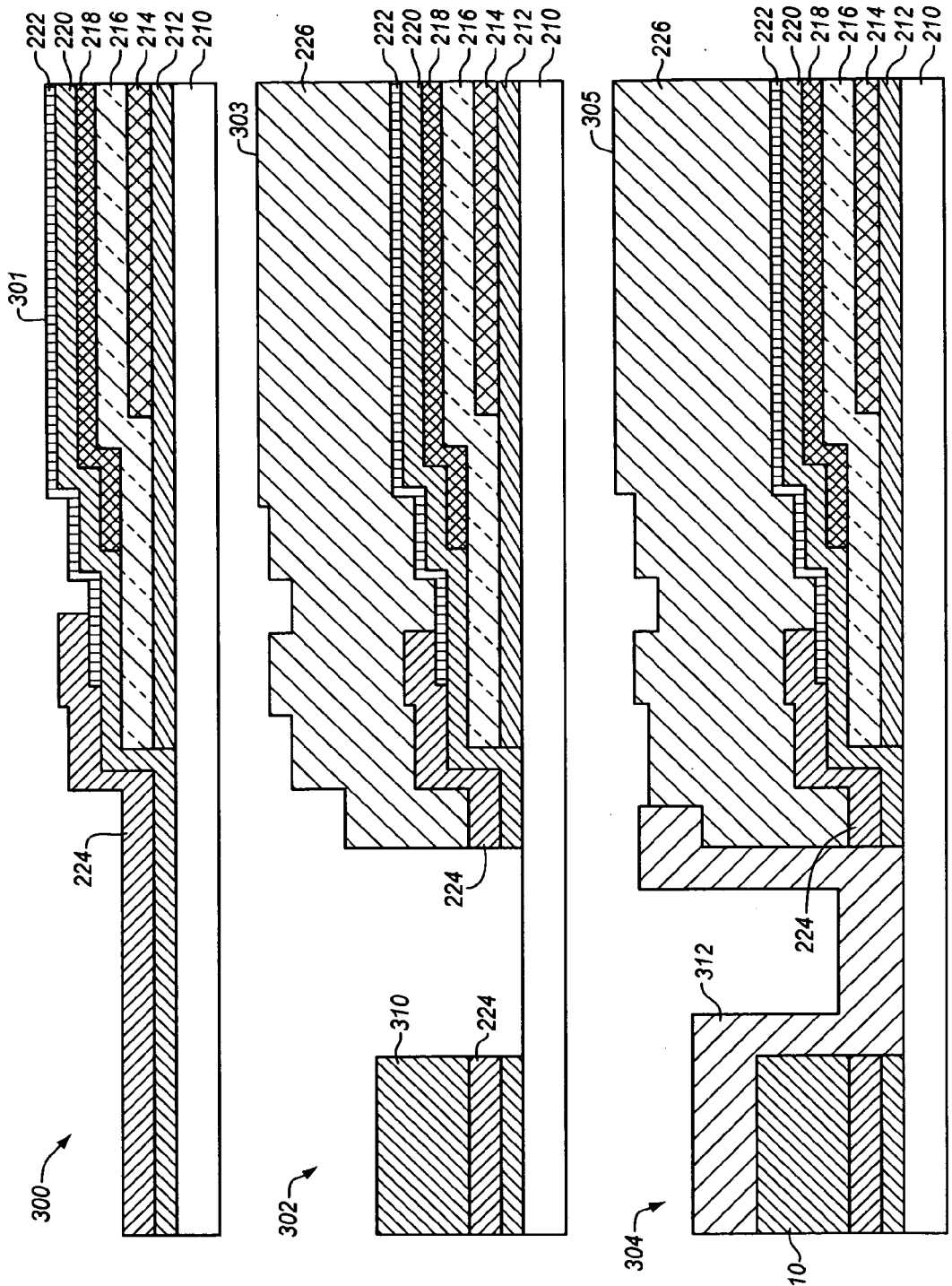
FIG. 3 is a diagram of cross-sectional views of an outer tier of scan and data contact fingers in a detector panel in accordance with one or more embodiments.
Figure 4:
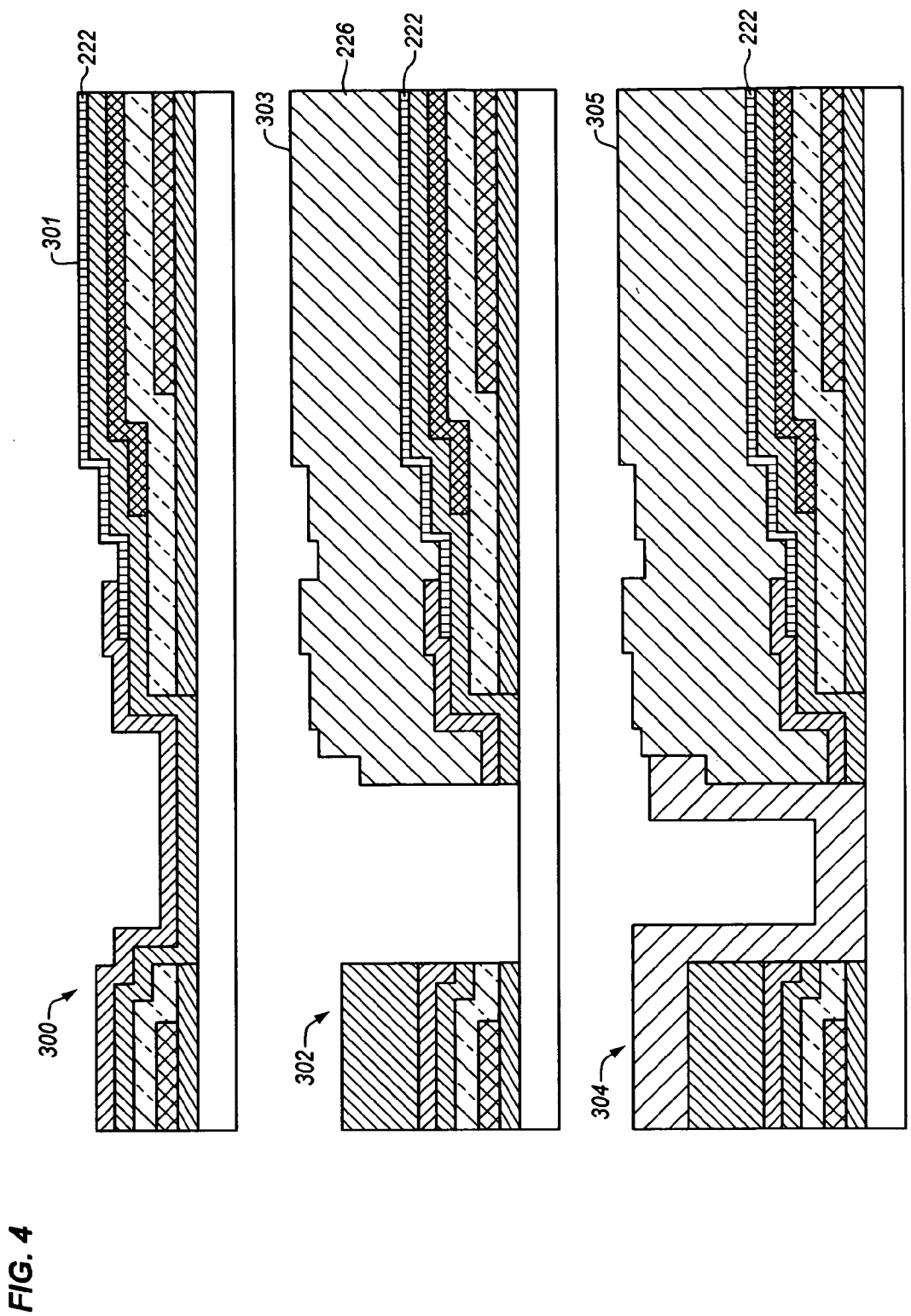
FIG. 4 is a diagram of cross-sectional views of an inner tier of contact fingers in a detector panel in accordance with one or more embodiments.

Referring now to FIG. 3 and FIG. 4, diagrams of cross-sectional views of an outer tier of scan and data contact fingers and inner tier contact fingers in a detector panel in accordance with one or more embodiments will be discussed. As shown in FIG. 3 and FIG. 4, another aspect in accordance with one or more embodiments may include leaving a diode island on top of one or more contact fingers. FIG. 3 shows an arrangement for an outer contact finger, and FIG. 4 shows an arrangement for an inner contact finger adjacent to the pixel array of detector panel 116. In order to assure the contact finger to be the highest, or at least sufficiently highest, spot to allow a reliable electrical contact to the panel tester, a contact finger structure may be designed as shown in FIG. 3 and FIG. 4. Prior to diode processing as shown at 300 after forming via structures for the diodes, metallization layer 222 may be the highest layer 301. After HRC etching as shown at 302, diode 226 may be the highest layer 303. After barrier nitride etching as shown at 304, diode 226 may remain the highest layer 305 even after adding diode pass layer 310 and barrier layer 312. In one or more embodiments, diode islands comprising diodes 226 may be disposed at the highest position, or at least sufficiently highest position, as measured from glass substrate 210. In one or more embodiments, in order to ensure that diodes 226 in the fingers are the highest points, dielectric surrounding a contact finger may be removed, and then the contact finger opening may be placed beyond an edge of metallization layer 218 (M2 metal) and optionally inside and edge metallization layer 222 (M3 metal), although the scope of the claimed subject matter is not limited in this respect.

Figure 5:
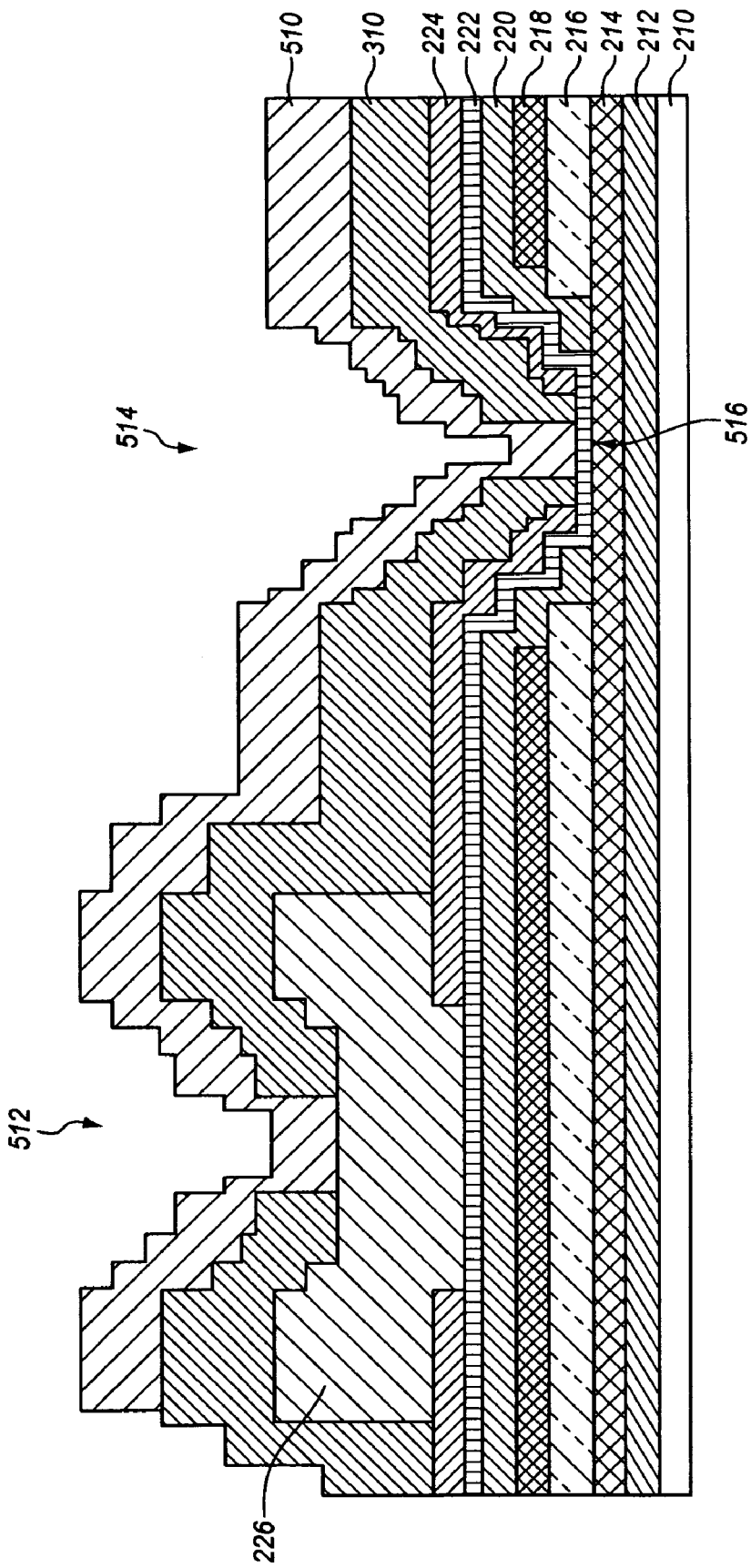
FIG. 5 is a diagram of a cross-sectional view of vias in a detector panel in accordance with one or more embodiments.

Referring now to FIG. 5, a diagram of a cross-sectional view of vias in a detector panel in accordance with one or more embodiments will be discussed. FIG. 5 shows a cross-sectional view of via structures 512 and 514 where a further metallization layer 510, referred to as M4 metal, may connect electrically between the top of a diode island comprising diode 226 and other metallization layers such as, for example, metallization layer 222 (M3 metal) and/or metallization layer 214 (M1 metal) underneath the diode island in the finger design. Metallization layer 218 comprising aluminum containing M2 metal, which in one embodiment may comprise a layer of aluminum thin film, may be purposely etched off in via 514 to form a robust aluminum free M3/M1 metal stack 516 of metallization layer 215 in contact with metallization layer 222 as shown at 516 for the wet HF etch stop of contact via 514. Metallization layer 510 (M4 metal) may be arranged to make contact to such a M1/M3 metal stack at 516 which may be arranged to be electrically connected with metallization layer 218 (M2 metal) through another via (not shown) opened previously between metallization layer 218 (M2 metal) and metallization layer 214 (M1 metal), for example. In such an arrangement, during HF we etching, any attack of HF on the aluminum of metallization layer 218 (M2 metal) may be avoided. Similar via structure arrangements may likewise be employed in one or more other locations, although the scope of the claimed subject matter is not limited in this respect.

Figure 6:
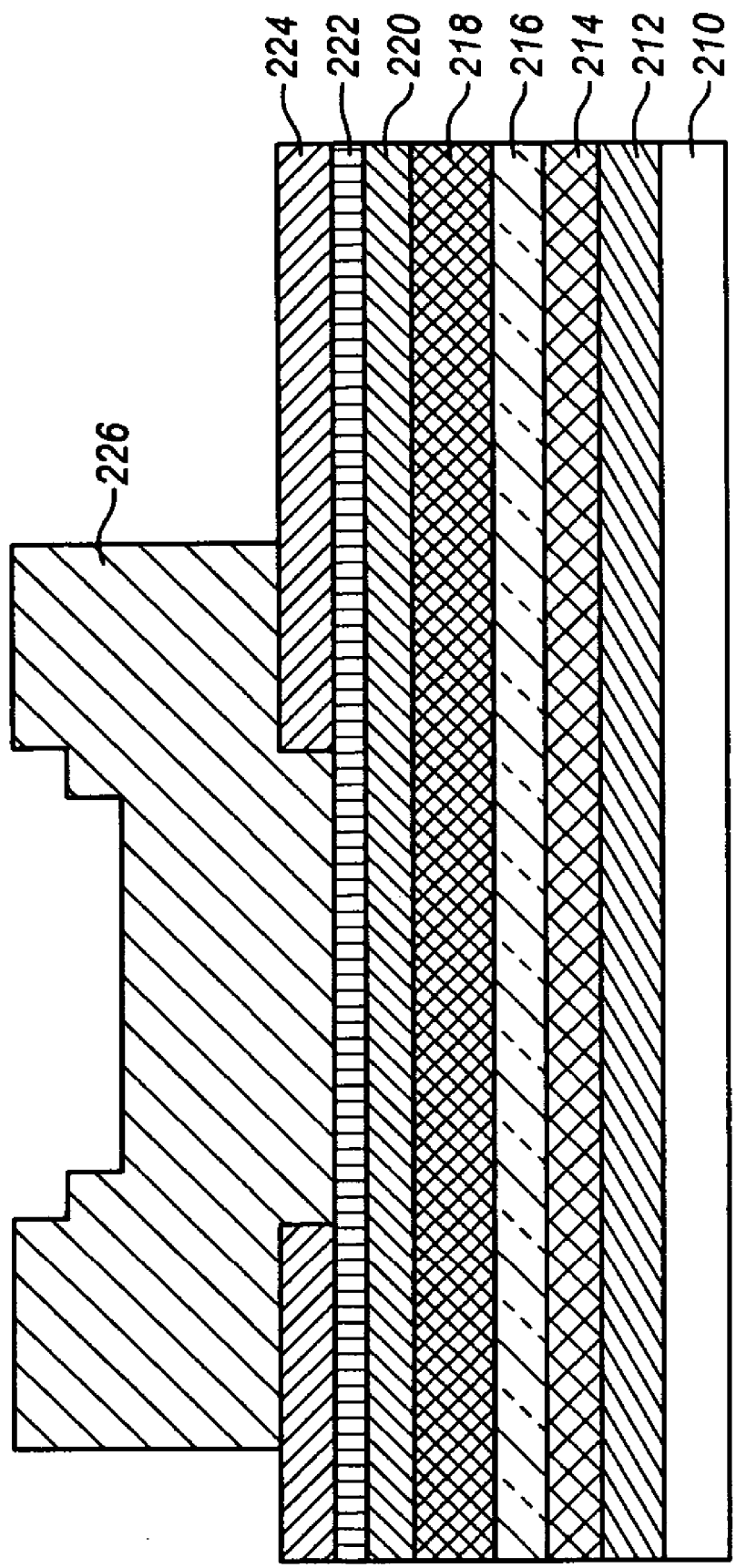
FIG. 6 is a diagram of a cross-sectional view of a diode including an additional layer of nitride and a an additional metallic layer in accordance with one or more embodiments.

Referring now to FIG. 6, a diagram of a cross-sectional view of a diode including an additional layer of nitride and an additional metallic layer in accordance with one or more embodiments will be discussed. As shown in FIG. 6, metallization layer 222, for example having a thickness of 700 angstroms, comprising pure, or nearly pure, molybdenum (Mo) or the like and/or a molybdenum alloy such as molybdenum-tungsten (MoW) or the like may be added between diode 226 and metallization layer 218 (M2 metal) and disposed on layer 220. Metallization layer 222 may be referred to as M3 metal. Likewise, an extra layer 224 of silicon nitride, for example having a thickness of 2500 angstroms, may be disposed between metallization layer 222 and diode 226. Metallization layer 222 (M3 metal) may be electrically connected to a source and/or drain metal layer, for example metallization layer 214, through another via such as via 514 of FIG. 5 disposed outside diode island comprising diode 226, although the scope of the claimed subject matter is not limited in this respect. In one or more embodiments, diode 226 may not directly contact metallization layer 218 but instead may make electrical contact with metallization layer 218 via metallization layer 222 in order to avoid any potential diode reliability issue related to the interdifflision of aluminum from metallization layer 218 into electrical junctions of diode 226, although the scope of the claimed subject matter is not limited in this respect.

Referring now FIG. 7, a diagram of a cross-sectional view of diode via designs in accordance with one or more embodiments will be discussed. As shown in FIG. 7, a first diode via 700 may comprise a structure that extends down through diode pass layer 310 and layer 224 to expose metallization layer 222. Layers beneath metallization layer 222 may remain intact and generally planar with respect to diode via 700. In such an arrangement, metallization layer 222 does not contact metallization layer 218 and/or metallization layer 214 in the region below diode via 700. Diode via 700 may generally v-shaped in cross-section to receive a diode layer to form diode 226 within the v-shaped region, although the scope of the claimed subject matter is not limited in this respect.

A second diode via 702 may comprise a structure that extends down through metallization layer 218 to metallization layer 214. Metallization layer 222 may be disposed to contact metallization layer 214 but may be insulated from metallization layer 218 by dielectric layer 220. In general, metallization layer 214 may remain generally planar whereas etching and/or deposition of layers above metallization layer may result in diode via 702 being generally v-shaped in cross-section and having stepped sidewalls. Such stepped sidewall structures may provide increased adhesion of the diode layer to the TFT layers when diode 226 is formed within diode via 702, although the scope of the claimed subject matter is not limited in this respect.

A third diode via 704 may comprise a structure that extends down through metallization layer 218 to reach layer 212 which in one embodiment may be a source and/or drain contact region of a corresponding TFT. Metallization layer 222 may be disposed to contact layer 212 but be insulated from metallization layer 218 by dielectric layer 220. In general, layers 214-212 may remain generally planar whereas etching and/or deposition of layers above layer 212 may result in diode via 704 being generally v-shaped in cross-section and having stepped sidewalls. Similar to the stepped sidewalls of diode via 702, such stepped sidewalls of diode via 704 may provide increased adhesion of the diode layer to the TFT layers when diode 226 is formed within diode via 704, although the scope of the claimed subject matter is not limited in this respect.

In one or more embodiment, diode vias such as vias 200-206 of FIG. 2 and/or vias 700-704 of FIG. 7 may be formed in a TFT array at one or more suitable locations and/or in varying via density, size, and/or shape. Such vias, may improve adhesion of the diodes to the FET passivating nitride of the TFT array. In one or more embodiments, such via structures may be disposed at locations of detector panel 1116 where there are no or fewer topographic features in the array and/or outside the array in an edge clear area. Furthermore, in one or more embodiments, such via structures may be disposed at locations where there is plain metal underneath the FET passivating nitride. To prevent dilute HF acid from attacking aluminum in metallization layer 218 (M2 metal) during the diode forming processes, metallization layer 222 comprising a Mo or MoW metal stack 516 may be added in the via region as an etch stop, and/or optionally utilizing a dry plasma etch to replace and/or reduce the dilute HF wet etch process when appropriate. In order to improve longer term reliability of the a-Si diode film, metallization layer 222 may comprise pure, or nearly pure, molybdenum disposed on top of FET passivation nitride so that the a-Si of the diode layer may directly contract metallization layer 222 rather than contacting metallization layer 218 which may comprise aluminum, although the scope of the claimed subject matter is not limited in this respect.

Figure 8:
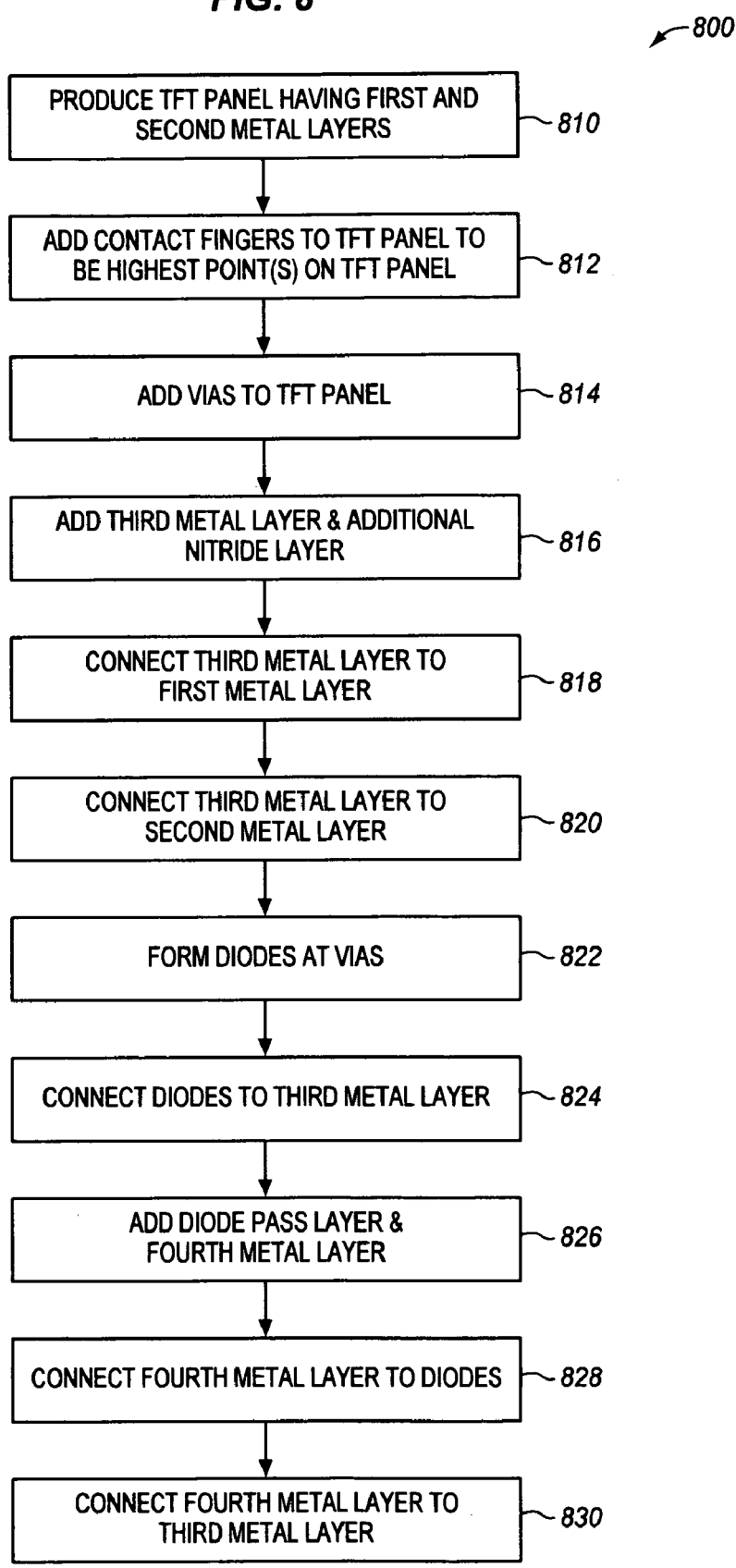
FIG. 8 is a flow diagram of a method for producing a detector panel comprising a TFT array and a diode array in accordance with one or more embodiments.

Referring now to FIG. 8, a flow diagram of a method for producing a detector panel comprising a TFT array and a diode array in accordance with one or more embodiments will be discussed. Method 800 of FIG. 8 may include more and/or fewer blocks than shown, and/or the blocks of method 800 may be arranged in one or more other orders, and is not necessarily limited to the order shown in FIG. 8. In accordance with one or more embodiments, a TET array may be produced at block 810 having first and/or second metal layers. For example, such a TFT array may include metallization layer 214 and/or metallization layer 218. Contact fingers may be added to the TFT array at block 812 wherein the contact fingers may be the highest point or points on the TFT array. Vias may be added to the TFT array at block 814 at various positions for improved adhesion of a diode layer to the TFT array. Optionally, the vias may be formed via a HF acid wet etch, or alternatively via a plasma etch, although the scope of the claimed subject matter is not limited in this respect. A third metallization layer 222 may be added to the TFT array at block 816, optionally along with an additional nitride layer. In one or more embodiments, the third metallization layer 222 may be optionally connected to the first metallization layer 214 at block 818 at one or more strategic locations. Likewise, in one or more embodiments, the third metallization layer may be optionally connected to the second metallization layer 218 at block 820 at one or more strategic locations. A diode layer may be deposited on the TFT to form diodes at one or more of the vias at block 822. The diodes may be connected at block 824 to the third metallization layer 222. A diode passer layer and/or a fourth metallization layer 510 may be added at block 826 to the TFT array. The fourth metallization layer 510 may be connected to the diodes 226 at block 828. Optionally, the fourth metallization layer 510 may be connected to the third metallization layer 222 at block 830. Method 800 describes one method by which detector panel 116 comprising a photodiode array may be formed on a TFT array, however various other methods may also be utilized, and the scope of the claimed subject matter is not limited in this respect.

Although the claimed subject matter has been described with a certain degree of particularity, it should be recognized that elements thereof may be altered by persons skilled in the art without departing from the spirit and/or scope of the claimed subject matter. It is believed that a thin-film transistor and diode array for an imager panel or the like and/or many of its attendant advantages will be understood by the forgoing description, and it will be apparent that various changes may be made in the form, construction and/or arrangement of the components thereof without departing from the scope and/or spirit of the claimed subject matter or without sacrificing all of its material advantages, the form herein before described being merely an explanatory embodiment thereof, and/or further without providing substantial change thereto. It is the intention of the claims to encompass and/or include such changes.

What is claimed is:

1. An apparatus, comprising:
   an insulator substrate; and
   a first area comprising at least one or more layers of metal, a layer of dielectric disposed on said at least one or more layers of metal, and one or more vias formed in the dielectric to couple a diode layer to at least one or more layers of the metal; and
   a second area comprising zero or more vias formed in the dielectric to adhere the diode layer to at least the insulator substrate
   wherein at least some of the vias are disposed on an edge clear area having no electrical function with the insulator substrate.

2. An apparatus as claimed in claim 1, said diode layer comprising at least one or more photodiodes.

3. An apparatus as claimed in claim 1, said at least one or more metal layers comprising a first metallization layer and a second metallization layer, at least one or more of said vias having a structure capable of allowing the diode layer to contact the first metallization layer without contacting the second metallization layer.

4. An apparatus as claimed in claim 1, said at least one or more metal layers comprising a first metallization layer, a second metallization layer, and a third metallization layer, at least one or more of said vias having a structure capable of allowing the diode layer to contact the third metallization layer without contacting the second metallization layer.

5. An apparatus as claimed in claim 1, said at least one or more metal layers comprising a first metallization layer, a second metallization layer, and a third metallization layer, at least one or more of said vias having a structure capable of allowing the diode layer to contact the third metallization layer without contacting the second metallization layer, wherein a diode of said diode layer contacts the second metallization layer via the third metallization layer.

6. An apparatus as claimed in claim 1, said at least one or more metal layers comprising a first metallization layer, a second metallization layer, and a third metallization layer, at least one or more of said vias having a structure capable of allowing the diode layer to contact the third metallization layer without contacting the second metallization layer, said third metallization layer comprising molybdenum or a molybdenum alloy.

7. An apparatus as claimed in claim 1, said at least one or more metal layers comprising a first metallization layer, a second metallization layer, and a third metallization layer, at least one or more of said vias having a structure capable of allowing the diode layer to contact the third metallization layer without contacting the second metallization layer, said third metallization layer consisting of molybdenum or a molybdenum alloy.

8. An apparatus as claimed in claim 1, said at least one or more metal layers comprising a first metallization layer, a second metallization layer, and a third metallization layer, at least one or more of said vias having a structure capable of allowing the diode layer to contact the third metallization layer without contacting the second metallization layer, said third metallization layer consisting essentially of molybdenum or a molybdenum alloy.

9. An apparatus as claimed in claim 1, at least one or more of said vias comprising stepped sidewall structures.

10. An apparatus as claimed in claim 1, said at least one or more metal layers comprising a first metallization layer, a second metallization layer, and a third metallization layer, and an additional dielectric layer, wherein said second layer is insulated from the diode layer when formed in said vias by at least one of said third metallization layer or said additional dielectric layer, or a combination thereof.

11. An apparatus as claimed in claim 1, further comprising a conducting film disposed on said dielectric.

12. An apparatus as claimed in claim 1, further comprising a conducting film disposed on said dielectric, said conducting film comprising indium-tin oxide.

13. An apparatus as claimed in claim 1, further comprising a conducting film disposed on said dielectric, wherein at least one of said vias is capable of coupling the said at least one or more metal layers to said conducting film.

14. An apparatus as claimed in claim 1, wherein at least one of said vias is capable of coupling said at least one or more metal layers to a diode terminal of the diode layer.

15. The apparatus of claim 1, wherein the insulator substrate comprises a glass substrate.

\* \* \* \* \*